(12) United States Patent
Fomin et al.

(10) Patent No.: US 9,995,781 B2
(45) Date of Patent: Jun. 12, 2018

(54) GROUND FAULT DETECTION FOR PCB AND ISOLATION GROUNDS

(71) Applicant: Texas Instruments Incorporated, Dallas, TX (US)

(72) Inventors: Evgeny Fomin, San Carlos, CA (US); Andrew Wang, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 303 days.

(21) Appl. No.: 14/835,696

(22) Filed: Aug. 25, 2015

(65) Prior Publication Data

US 2016/0054370 A1    Feb. 25, 2016

Related U.S. Application Data

(60) Provisional application No. 62/041,645, filed on Aug. 25, 2014.

(51) Int. Cl.
| | |
|---|---|
| *G01R 31/14* | (2006.01) |
| *G01R 31/02* | (2006.01) |
| *G01R 31/312* | (2006.01) |
| *G01R 1/18* | (2006.01) |

(52) U.S. Cl.
CPC ......... *G01R 31/025* (2013.01); *G01R 31/312* (2013.01); *G01R 1/18* (2013.01)

(58) Field of Classification Search
CPC ....... G01R 31/025; G01R 31/312; G01R 1/18
See application file for complete search history.

(56) References Cited

U.S. PATENT DOCUMENTS 5,241,443 A * 8/1993 Efantis ................... H02H 7/045
324/509

* cited by examiner

*Primary Examiner* — Daniel Miller
(74) *Attorney, Agent, or Firm* — Andrew Viger; Charles A. Brill; Frank D. Cimino

(57) ABSTRACT

A ground fault detection system based on capacitive sensing suitable for use in detecting a ground fault condition in electronic equipment (such as a PCBA) with a circuit ground electrically isolated from an isolation ground (such as chassis ground). The capacitive sensing system includes a capacitive sensor capacitively coupled to the system isolation ground, and a capacitance/data converter that captures sensor capacitance measurements for conversion to sensor data representative of a ground short. In one embodiment, the capacitive sensor includes a sensor electrode capacitively coupled to the system isolation ground by one of projected capacitance and a floating capacitor (such as 33 pf), and the CDC unit further includes sensor excitation circuitry configured to drive the sensor electrode, such that a sensor capacitance (projected or floating capacitance) is representative of an electrical condition of the system isolation ground. For sensing by projected capacitance, the capacitive sensor can include a driven shield.

18 Claims, 2 Drawing Sheets

GND1: PCB/local ground
GND2: Chassis/system isolation ground

GROUND FAULT DETECTION FOR PCB AND ISOLATION GROUNDS

CROSS-REFERENCE TO RELATED APPLICATIONS

Priority is claimed under 37 CFR 1.78 and 35 USC 119(e) to U.S. Provisional Application 62/041,645, filed 25 Aug. 2014, which is incorporated by reference.

BACKGROUND

Technical Field

This Patent Disclosure relates generally to resistor ladder DACs (digital to analog converters), and more particularly to multi-ladder DACs.

Related Art

Integrated circuit (IC) electronics need to be protected from electrical interference/damage. For example, ESD (electrostatic discharge) can damage ICs or reduce IC life cycle.

One protection mechanism is to incorporate the electronics within a chassis or case that is separately grounded, so that the internal electronics (PCB) ground is isolated from the chassis (earth) ground. A ground fault condition occurs if the PCB ground shorts to the chassis ground. Off-line circuit diagnostics can be performed (such as through current injection), but for some applications, such as automation, off-line diagnostics are disruptive.

While this Background information references a PCB/Chassis system, the Disclosure in this Patent Document is more generally directed to ground fault detection based on capacitive sensing.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for ground fault detection based on capacitive sensing, such as can be used to detect ground fault conditions in electronic equipment (such as a PCBA) with a circuit ground electrically isolated from an isolation ground (such as chassis ground).

According to aspects of the Disclosure, the a ground fault detection system based on capacitive sensing includes a capacitive sensor capacitively coupled to the system isolation ground, and a capacitance/data converter that captures sensor capacitance measurements for conversion to sensor data representative of a ground short. In one embodiment, the capacitive sensor includes a sensor electrode capacitively coupled to the system isolation ground by one of projected capacitance and a floating capacitor (such as 33 pf), and the CDC unit further includes sensor excitation circuitry configured to drive the sensor electrode, such that a sensor capacitance (projected or floating capacitance) is representative of an electrical condition of the system isolation ground. For sensing by projected capacitance, the capacitive sensor can include a driven shield.

Other aspects and features of the invention claimed in this Patent Document will be apparent to those skilled in the art from the following Disclosure.

DETAILED DESCRIPTION

This Description and the Drawings constitute a Disclosure for ground fault detection based on capacitive sensing, including example embodiments that illustrate various technical features and advantages.

In brief overview, ground fault detection based on capacitive sensing can be used to detect ground fault conditions in electronic equipment (such as a PCBA) with a circuit ground electrically isolated from an isolation ground (such as chassis ground). The a ground fault detection system can include a capacitive sensor capacitively coupled to the system isolation ground, and a capacitance/data converter that captures sensor capacitance measurements for conversion to sensor data representative of a ground short. In one embodiment, the capacitive sensor includes a sensor electrode capacitively coupled to the system isolation ground by one of projected capacitance and a floating capacitor (such as 33 pf), and the CDC unit further includes sensor excitation circuitry configured to drive the sensor electrode, such that a sensor capacitance (projected or floating capacitance) is representative of an electrical condition of the system isolation ground. For sensing by projected capacitance, the capacitive sensor can include a driven shield.

Figure 1:
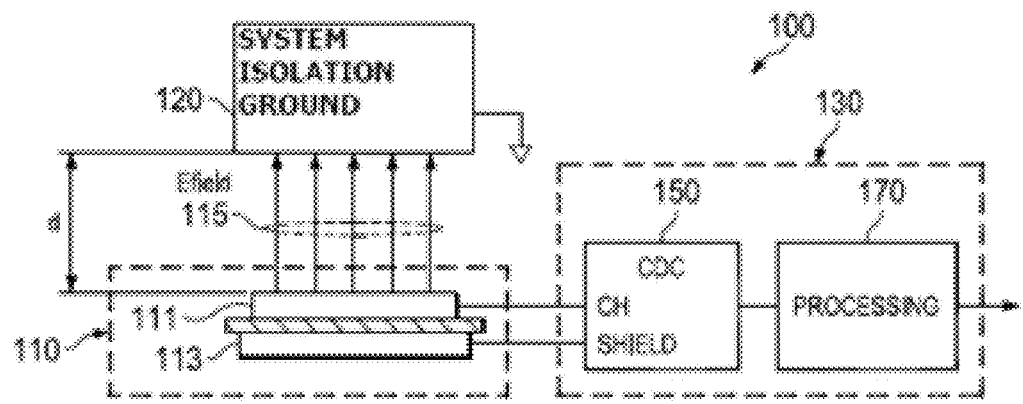
FIG. 1 is an example functional illustration of a capacitive sensing system (100) suitable for detecting ground faults with respect to an isolation ground (120) manifested as an abrupt change in sensor capacitance, where, for this example, capacitive sensing is based on projected self-capacitance with a driven sensor electrode (110).
Figure 2:
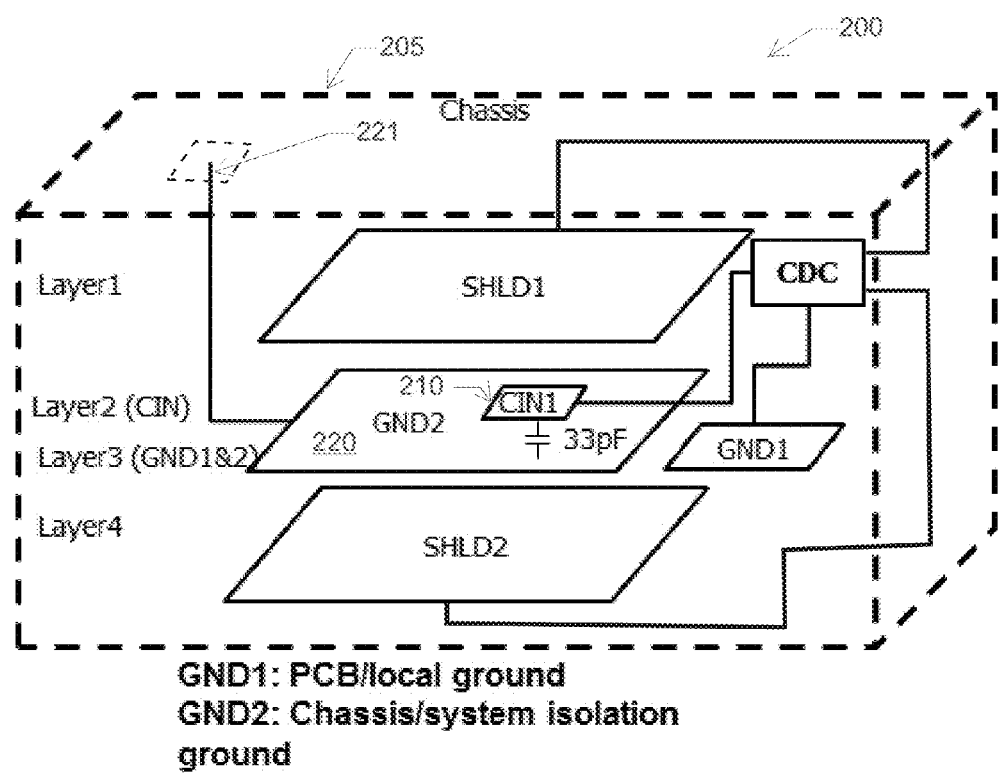
FIG. 2 is an example functional embodiment of a ground fault detection system (200) based on capacitive sensing, adapted for use in example electrical equipment including a PCBA (printed circuit board assembly) installed in a chassis (case) (205), in which the PCBA includes a PCB/local (electronics/circuit) ground plane GND1, and the chassis provides a chassis/system isolation ground GND2 (220) with connection (221) to chassis (205), and configured with a sensor capacitor (CIN1) located in proximity to GND2, and a CDC (Capacitance/Data Converter) coupled to CIN1 and referenced to GND1.

FIGS. 1 and 2 illustrate and example functional embodiment of a capacitive sensing system 100 adapted for detecting ground fault conditions, in which an electronics/circuit ground (not shown) is shorted to a system isolation ground 120. FIG. 2 is an example functional embodiment of a ground fault detection system based on capacitive sensing system 100, adapted for use in electrical equipment in which GND1 is a PCB/local (electronics/circuit) ground plane, and GND2 is a chassis/system isolation ground.

FIG. 1 is an example functional illustration of a capacitive sensing system 100 suitable for detecting ground faults with respect to an isolation ground 120 manifested as an abrupt change in sensor capacitance, where, for this example, capacitive sensing is based on projected self-capacitance with a driven sensor electrode 110.

Capacitive sensing system 100 includes a capacitive sensor 110, adapted for location in proximity to a system isolation ground 120, and a ground fault detection system 130 formed by a capacitance-to-digital conversion (CDC) unit 150, and a data processor 170. In the example ground fault detection system of FIG. 2, capacitive sensor CIN1 (for example, 33 pF) is located in proximity to system isolation ground GND2, and CDC 150 is coupled to CIN1 and referenced to the PCB/local (circuit) ground GND1.

The components of the capacitive sensing system need not all be co-located, but to reduce the effects of parasitic capacitance, CDC 150 is preferably located as close as possible to capacitive sensor 110. Communication to data processor 170 can be wireless.

Capacitive sensing system 100 is configured for capacitive sensing based on projected self-capacitance. Capacitive sensor 110 (FIG. 2, CIN1) includes a sensor electrode 111 located in proximity to system isolation ground 120 (FIG. 2, chassis/system isolation ground GND2), and a sensor shield 113, disposed over, and insulated from, the sensor electrode. CDC 150 is coupled to capacitive sensor 110 (sensor electrode 111), and referenced to circuit ground (FIG. 2, PCB/ local ground plane GND1). CDC 150 provides excitation drive to sensor electrode 111, projecting an E-field 115 toward system isolation ground 120. The self-capacitance of capacitive sensor 110 (referenced to circuit ground) changes based on electrical condition of system isolation ground 120, which affects the E-field 115 projected by sensor capacitor 110 and therefore sensor capacitance.

CDC 150 acquires capacitance measurements from capacitive sensor 110 through an acquisition channel. The sensor capacitance readings are converted to digital sensor data representative of the electrical condition of the system isolation ground 120 (FIG. 2, chassis/system isolation ground GND2). CDC 150 outputs the sensor data for processing by data processor 170, such as for detecting abrupt changes in sensor capacitance representative of a ground fault condition, and signaling or otherwise responding to the ground fault condition.

For example, referring to FIG. 2, if GND1 is isolated from GND2, then the sensor capacitance reading from CIN1 acquired by the CDC will be nearly zero (a small parasitic capacitance value), and correspondingly the converted CDC sensor data will indicate a normal ground isolation condition. If GND1 shorts to GND2, then the sensor capacitance reading from CIN1 will abruptly change, for example, to a full scale sensor capacitance reading, so that the converted CDC sensor data will indicate a ground fault (short) condition. The CDC sensor data can be provided to data processor 170, and processed to signal (respond to) the ground fault condition.

CDC 150 can be configured to provide shield drive to sensor shield 113, generating a shield E-field that affects the projected sensor E-field 115. For example, shield drive can be configured to generate the shield E-field with substantially the same polarity and phase as the sensor E-field, focusing the sensor E-field in the direction of system isolation ground 120, and counteracting parasitic capacitance.

In one implementation, CDC 150 can be configured for acquisition/conversion based on multi-phase capacitive charge transfer in which sensor excitation at a specified excitation frequency with excitation/charging and transfer/ discharging phases, and capacitance acquisition involves acquiring capacitance measurements based on capacitive charge transfer (charging the sensor capacitor during the excitation/charging phase, and discharging the sensor electrode during the transfer/discharging phase).

FIG. 2 is an example functional embodiment of a ground fault detection system 200 based on capacitive sensing, adapted for use in example electrical equipment including a PCBA (printed circuit board assembly) installed in a chassis (case) 205. The PCBA includes a PCB/local (electronics/ circuit) ground plane GND1, and the chassis provides a chassis/system isolation ground GND2 220, with connection 221 to chassis 205.

The capacitive sensing system includes a sensor capacitor CIN1, and a capacitance-to-digital converter (CDC) 250, referenced to GND1.

Sensor capacitor CIN1 can be located proximate to the chassis/system isolation ground GND2 for capacitive sensing based on projected capacitance, or connected to isolation ground GND2 with a floating capacitor (for example, 33 pF).

For capacitive sensing based on projected capacitance, driven shields can be used to improve accuracy and/or resolution. for the functional embodiment in FIG. 2, CDC 250 is designed to drive two shields, SHLD1 and SHLD2.

Figure 3:
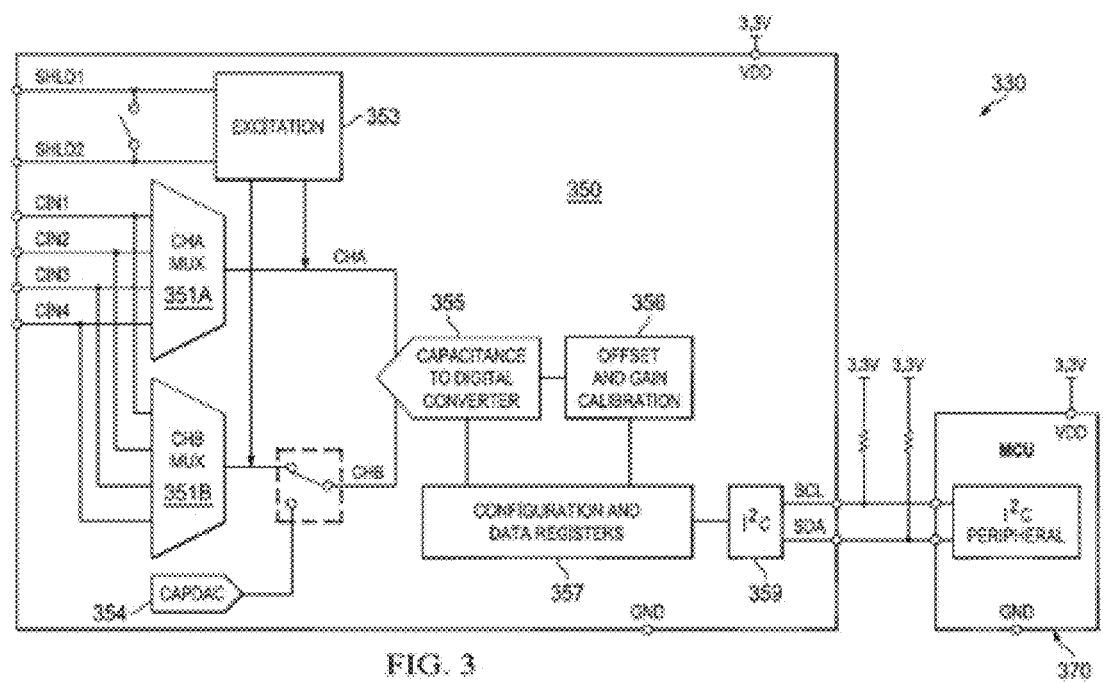
FIG. 3 illustrates an example multi-channel CDC (350) suitable for use in capacitive sensing system for ground fault detection such as in FIG. 2, including capacitive sensing (excitation), capacitance acquisition (measurement), and data conversion (such as conversion of analog capacitance measurements to digital data).

FIG. 3 illustrates an example multi-channel CDC (capacitance/data converter) 350 suitable for use in capacitive sensing system for ground fault detection such as in FIG. 2, including capacitive sensing (excitation), capacitance acquisition (measurement), and data conversion (such as conversion to digital data).

CDC 350 implements capacitance-to-digital conversion for a capacitance sensing system based on projected self-capacitance, with sensor excitation and shield drive. CDC 350 includes dual acquisition channels CHA/CHB for sensor capacitance measurements (single ended or differential), and a capacitance-to-digital converter 355 for converting sensor capacitance measurements to representative sensor data provided to an MCU (micro controller unit), which can be used to detect/process abrupt changes in sensor capacitance as indicating a ground fault condition in which an electronics/ circuit ground (GND1 in FIG. 2) is shorted to a system isolation ground (GND2 in FIG. 2).

CDC 350 provides sensor data to a data processor 370 implemented as an MCU (micro-controller unit). CDC 350 can be interfaced to MCU 370 through a wired corn channel (such as the illustrated I2C) or through wireless communications.

CDC 350 includes four input/acquisition channels CIN1-4 and two shield drive channels SHLD1-2. For the example implementation in FIG. 2, a single sensor capacitor is illustrated as CIN1. Capacitance (positive and/or negative) is measured between CINx and GND (for example, with an input capacitance range of 0 pF to 15 pF).

The CINx channel inputs are multiplexed by channel multiplexers 351A/B into dual acquisition/measurement channels CHA/CHB. CDC 350 is configurable for single-ended (CHA) or differential (CHA/CHB) capacitance measurement. The example implementation in FIG. 2 is illustrated as single-ended.

CDC 350 implements capacitance acquisition/measurement based on multi-phase capacitive charge transfer. Excitation block 353 is configured to provide sensor excitation and shield drive. Sensor excitation is provided at a specified excitation frequency for capacitive charge transfer, with each charge transfer cycle including excitation/charging and transfer/discharging phases. Shield drive can be provided synchronously with sensor excitation frequency, and can be used to focus sensing direction, and to counteract CINx parasitic capacitance.

Sensor excitation at the excitation frequency establishes sensor self-capacitance, projecting a sensor E-field from the sensor electrode toward the system isolation ground (FIG. 2, CIN1/GND2). During the excitation/charging phase, a sense voltage is applied to CINx, charging the sensor electrode (either positive only or positive/negative charging voltages). During the transfer/discharging phase the sensor electrode is discharged into a designated acquisition channel CHA/CHB (at a common/reference voltage), transferring charge that is a measure of the self-capacitance of the capacitive sensor.

Specifically, CDC 350 measures sensor capacitance (referenced to circuit ground), which depends on the electrical condition of the system isolation ground, and in particular, CDC 350 detects any abrupt change in sensor capacitance representative of a ground fault condition (FIG. 2, GND1 shorted to GND2).

Excitation block 353 can be configured to drive the sensor shield to the same voltage as CINx (at the sensor excitation frequency), so that any capacitance between the CINx and SHLDx pins does not affect CINx charge transfer. That is, SHLD1-2 can be driven so that the shield E-field is substantially the same polarity and phase as the sensor E-field. SHLD1 is used to shield channels coupled to acquisition CHA (through multiplexer 351A), and SHLD2 is used to shield channels coupled to acquisition CHB (through multiplexer 351B). In a single ended configuration, SHLD1 is shorted to SHLD2. If a shielded cable is used for sensor connection, the cable shield should be connected to the SHLDx pins.

CAPDAC 354 can be used to balance common-mode or offset capacitance. CAPDAC 354 provides a negative capacitance with a programmable resolution, and is connected internally to the CINx pins so that Sensor Data≈ (CINx or CINy)–CAPDAC). For example, CAPDAC 354 can be used for programmable shifting of the input range, adding a programmable offset capacitance, enabling input capacitance measurements with a sensing range (for example, 0 pF to 15 pF) and with an offset capacitance (for example, up to 100 pF).

CDC 350 includes a capacitance-to-digital converter 355, offset and gain calibration 356, and configuration and data registers 357.

Converter 355 performs capacitance acquisition and data conversion. Converter 355 measures CHA/CHB input/acquisition capacitance, subject to CAPDAC offset, based on analog charge transfer. Specifically, sensor capacitance readings are acquired through phased charge transfer, such as with a switched capacitor arrangement. Converter 355 performs analog-to-digital conversion, converting the sensor self-capacitance measurements into digital data, such as with a sigma delta converter. Configuration/data registers 357 includes data registers used in conjunction with capacitance capture (acquisition/conversion) by converter 355.

Offset and gain calibration 356 can provide offset calibration used to offset parasitic capacitance, and gain calibration used to normalize capacitance measurements of the CINx input channels. Configuration/data registers 357 include configuration registers storing configuration values for offset/gain calibration. Offset registers can store digitized capacitance values (for example, in the range of −16 pF to +16 pF) which can be added to each channel to remove parasitic capacitance due to external circuitry, including tuning offset capacitance provided by CAPDACs 354. Gain registers can store gain factor correction (for example, in the range of 0 to 4) which can be applied to each channel in order to remove gain mismatch due to external circuitry.

CDC 350 can be configured for interfacing to a single-ended, or dual differential capacitive sensors. For single-ended configurations, CDC 350 is coupled to a single-ended capacitive sensor through input CINx and GND (FIG. 2, PCB/circuit ground GND1)—in this configuration SHLD1 is internally shorted to SHLD2. For differential configurations, interfaced to a differential capacitive sensor with dual sensors, CDC 350 measures differential, unbalanced capacitance at CINx within the input capacitance range (for example, 15 pF), referenced to GND (FIG. 2, PCB/circuit ground GND1). In this configuration the SHLD1 signal operates with CHA, and the SHLD2 signal operates with CHB. CAPDAC is disabled.

CDC 350 can be configured to support two modes of operation, single acquisition and repeated acquisition. In single acquisition mode, only one capacitance acquisition/reading is enabled. CDC 350 is configured for appropriate acquisition parameters (repeat bit=0, and, for example, sample rate and notch filter). Single acquisitions capture a single sensor capacitance measurement, and store the result in configuration/data registers 357. In repeated acquisition mode, CDC 350 performs cycled acquisitions. CDC 350 is configured for appropriate acquisition parameters (repeat bit=1 and repeat value, and, for example, sample rate, notch filter). Cycled acquisitions capture successive sensor capacitance measurements, and store the results in a configuration/data registers 357.

Sensor data results captured into configuration/data registers 357 can be transferred from CDC 350 to MCU processor 370 in a data read operation. The sensor capacitance results in configuration/data registers 357 can be updated even if the registers are not read.

MCU 370 can be configured to detect any abrupt change in sensor capacitance as a ground fault condition (FIG. 2, GND1 shorted to GND2), and to signal or otherwise respond to the ground fault condition.

Advantages of the ground fault detection system based on capacitive sensing include ground fault detection without interrupting system operation, enabling ground fault conditions to be signaled in real time.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A ground fault detection system for use in detecting a ground fault condition in electronic equipment that includes a circuit ground electrically isolated from an isolation ground, where the ground fault condition occurs when the circuit ground shorts to the isolation ground, comprising:
   a capacitive sensor capacitively coupled to the system isolation ground, such that a sensor capacitance of the capacitive sensor is representative of an electrical condition of the system isolation ground; and
   a capacitance-to-data conversion (CDC) unit coupled to the capacitive sensor, and referenced to the circuit ground, and including:
      capacitance acquisition circuitry to acquire measurements of sensor capacitance for the capacitive sensor; and
      data conversion circuitry to convert the sensor capacitance measurements into sensor data representative of the electrical condition of the system isolation ground, including an isolated condition in which the circuit ground is isolated from the system isolation ground, and a ground fault condition in which the circuit ground shorts to the system isolation ground.

2. The system of claim 1, wherein
the capacitive sensor includes a sensor electrode capacitively coupled to the system isolation ground by one of projected capacitance and a floating capacitor connected between the sensor electrode and the system isolation ground; and
the CDC unit further includes sensor excitation circuitry to drive the sensor electrode, such that a sensor capacitance of the driven sensor electrode is representative of an electrical condition of the system isolation ground.

3. The system of claim 2, wherein
the capacitive sensor further includes a sensor shield disposed over and insulated from the sensor electrode;
the CDC unit further includes shield drive circuitry to drive the sensor shield to generate a shield E-field such that the sensor E-field is concentrated in the direction of the system isolation ground.

4. The system of claim 2, the CDC unit to convert sensor capacitance into sensor data based on capacitive charge transfer, and
the sensor excitation circuitry to provide sensor excitation at an excitation frequency with excitation/charging and transfer/discharging phases; and
the capacitance acquisition circuitry to acquire measurements of sensor capacitance based on capacitive charge transfer by integrating charge stored into the sensor electrode during the excitation/charging phase, and then discharged from the sensor electrode during the transfer/discharging phase.

5. The system of claim 1 further comprising a data processing unit to process the sensor data to detect a ground fault condition as an abrupt change in sensor data corresponding to the measured sensor capacitance.

6. The system of claim 1,
wherein the electrical equipment includes at least one PCBA configured with electronic circuitry, and installed in a chassis; and
wherein the circuit ground is a PCB/local ground, and the system isolation ground is a chassis/system isolation ground.

7. A capacitance-to-data conversion (CDC) circuit for use in detecting a ground fault condition in electronic equipment with a circuit ground electrically isolated from an isolation ground, where the ground fault condition occurs when the circuit ground shorts to the isolation ground, the electronic equipment including a capacitive sensor capacitively coupled to the system isolation ground, such that a sensor capacitance of the capacitive sensor is representative of an electrical condition of the system isolation ground, the CDC circuit comprising:
capacitance acquisition circuitry to couple to the capacitive sensor, and to acquire measurements of sensor capacitance for the capacitive sensor;
the CDC circuit referenced to the circuit ground; and
data conversion circuitry to convert the sensor capacitance measurements into sensor data representative of the electrical condition of the system isolation ground, including an isolated condition in which the circuit ground is isolated from the system isolation ground, and a ground fault condition in which the circuit ground shorts to the system isolation ground.

8. The CDC circuit of claim 7, wherein the capacitive sensor includes a sensor electrode capacitively coupled to the system isolation ground by one of projected capacitance and a floating capacitor connected between the sensor electrode and the system isolation ground, and the CDC circuit further comprises:
sensor excitation circuitry to drive the sensor electrode, such that a sensor capacitance of the driven sensor electrode is representative of an electrical condition of the system isolation ground.

9. The CDC circuit of claim 8, wherein the capacitive sensor further includes a sensor shield disposed over and insulated from the sensor electrode, the CDC circuit further comprising:
shield drive circuitry to drive the sensor shield to generate a shield E-field such that the sensor E-field is concentrated in the direction of the system isolation ground.

10. The CDC circuit of claim 8, the CDC circuit to convert sensor capacitance into sensor data based on capacitive charge transfer, including
the sensor excitation circuitry to provide sensor excitation at an excitation frequency with excitation/charging and transfer/discharging phases; and
the capacitance acquisition circuitry to acquire measurements of sensor capacitance based on capacitive charge transfer by integrating charge stored into the sensor electrode during the excitation/charging phase, and then discharged from the sensor electrode during the transfer/discharging phase.

11. The CDC circuit of claim 7, wherein CDC circuit is coupled to a data processing unit, and:
the CDC circuit to provide the sensor data to the data processing unit; and
the data processing unit to process the sensor data to detect a ground fault condition as an abrupt change in sensor data corresponding to the measured sensor capacitance.

12. The CDC circuit of claim 7,
wherein the electrical equipment includes at least one PCBA configured with electronic circuitry, and installed in a chassis; and
wherein the circuit ground is a PCB/local ground, and the system isolation ground is a chassis/system isolation ground.

13. A method for detecting a ground fault condition in electronic equipment that includes a circuit ground electrically isolated from an isolation ground, where the ground fault condition occurs when the circuit ground shorts to the isolation ground, the method comprising:
disposing in the equipment a capacitive sensor for capacitively coupling to the system isolation ground, such that a sensor capacitance of the capacitive sensor is representative of an electrical condition of the system isolation ground; and
including in the electronic equipment a capacitance-to-data conversion (CDC) unit referenced to the circuit ground, the CDC unit operable for:
acquiring measurements of sensor capacitance from the capacitive sensor; and
converting the sensor capacitance measurements into sensor data representative of the electrical condition of the system isolation ground, including an isolated condition in which the circuit ground is isolated from the system isolation ground, and a ground fault condition in which the circuit ground shorts to the system isolation ground.

14. The method of claim 13, wherein the capacitive sensor includes a sensor electrode capacitively coupled to the system isolation ground by one of projected capacitance, and a floating capacitor connected between the sensor electrode and the system isolation ground; and the CDC unit further operable for:

driving the sensor electrode, such that a sensor capacitance of the driven sensor electrode is representative of an electrical condition of the system isolation ground.

15. The method of claim 14, wherein the capacitive sensor further includes a sensor shield disposed over and insulated from the sensor electrode, and the CDC unit further operable for:

driving the sensor shield to generate a shield E-field such that the sensor E-field is concentrated in the direction of the system isolation ground.

16. The method of claim 14, the CDC unit further operable for:

converting sensor capacitance into sensor data based on capacitive charge transfer, including providing sensor excitation to the sensor electrode at an excitation frequency with excitation/charging and transfer/discharging phases; and acquiring measurements of sensor capacitance based on capacitive charge transfer by integrating charge stored into the sensor electrode during the excitation/charging phase, and then discharged from the sensor electrode during the transfer/discharging phase.

17. The method of claim 13, further comprising:

processing the sensor data to detect a ground fault condition as an abrupt change in sensor data corresponding to the measured sensor capacitance.

18. The method of claim 13, wherein the electrical equipment includes at least one PCBA configured with electronic circuitry, and installed in a chassis; and wherein the circuit ground is a PCB/local ground, and the system isolation ground is a chassis/system isolation ground.

* * * * *